(12) United States Patent
Arentz

(10) Patent No.: US 6,427,067 B1
(45) Date of Patent: Jul. 30, 2002

(54) DETECTOR DRIVEN BIAS CIRCUIT FOR POWER TRANSISTORS

(75) Inventor: Bernard James Arentz, Morristown, NJ (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/329,208

(22) Filed: Jun. 10, 1999

(51) Int. Cl.⁷ .................................................. H04B 1/06
(52) U.S. Cl. ...................... 455/232.1; 455/127; 330/296
(58) Field of Search .......................... 455/232.1, 234.1, 455/239.1, 244.1, 245.1, 250.1, 127; 330/296, 254, 260, 261, 271, 273, 285, 136, 279

(56) References Cited

U.S. PATENT DOCUMENTS

| | | | | |
|---|---|---|---|---|
| 3,720,880 A | * | 3/1973 | Le Seigneur | 330/282 |
| 4,317,083 A | * | 2/1982 | Boyd | 330/296 |
| 4,665,560 A | * | 5/1987 | Lange | 455/249.1 |
| 4,736,391 A | * | 4/1988 | Siegel | 375/317 |
| 6,052,032 A | * | 4/2000 | Jarvinen | 330/289 |
| 6,304,145 B1 | * | 10/2001 | Laureanti et al. | 330/285 |
| 6,313,705 B1 | * | 11/2001 | Dening et al. | 330/276 |

OTHER PUBLICATIONS

"Methods Linearize RF Transmitters And Power Amps", *Microwaves & RF*, Dec. 1998, pp. 102–110.
"Device And Circuit Approaches For Next–Generation Wireless Communications", *Microwave Journal*, Feb. 1999, pp. 22–42.

* cited by examiner

*Primary Examiner*—Dwayne Bost
*Assistant Examiner*—Sonny Trinh

(57) ABSTRACT

A power transistor (2) circuit for increasing the gain of an amplified RF signal has a power transistor (2), a voltage bias circuit biasing the power transistor 2, the voltage bias circuit having a peak detector (12) and a source of voltage (9) supplying respective outputs to a summer (13), and the summer (13) supplying the sum of outputs of the peak detector (12) and the source of voltage (9) to increase the bias of the power transistor (2) and provide an increased gain upon detection of an RF signal peak.

6 Claims, 3 Drawing Sheets

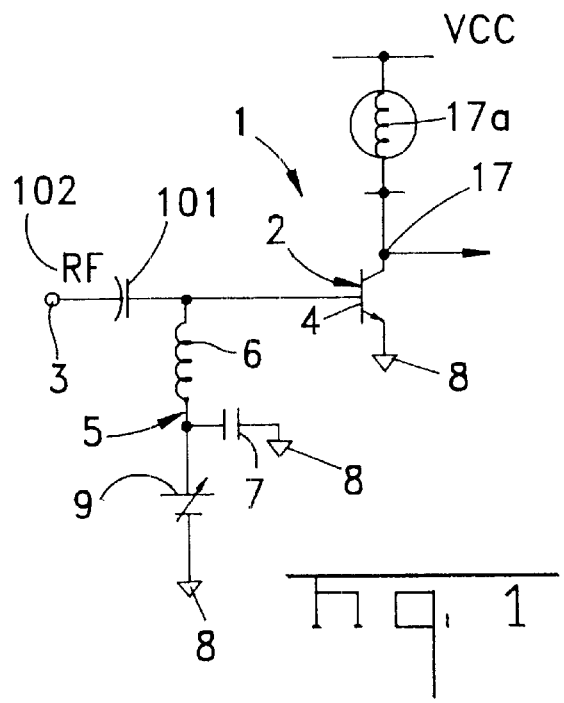
Fig. 1
"(PRIOR ART)"
Fig. 2
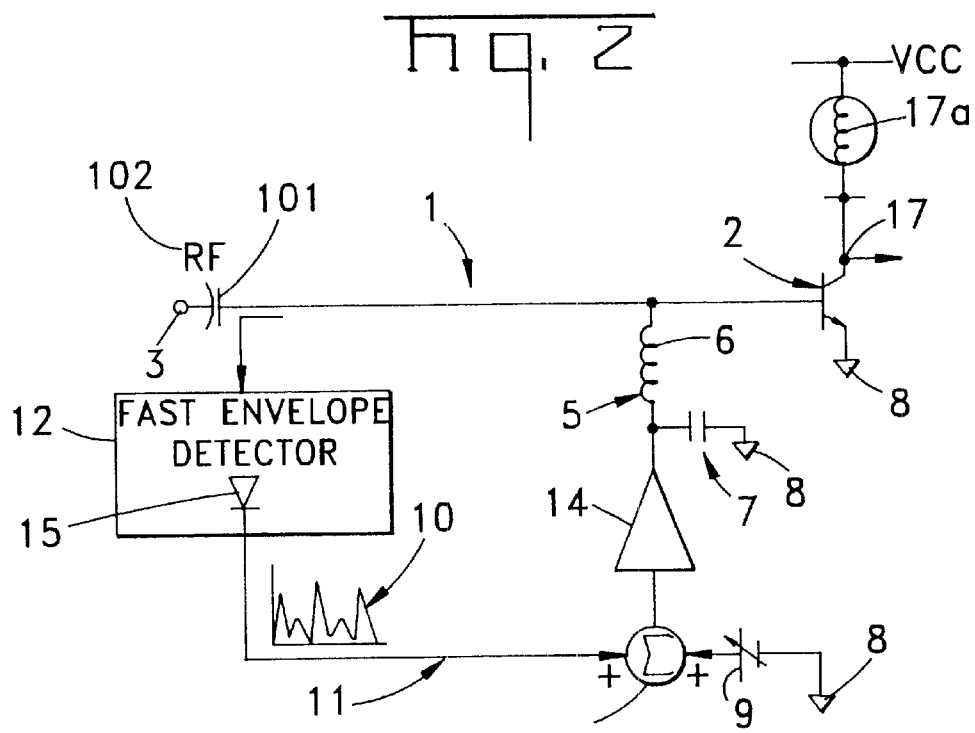

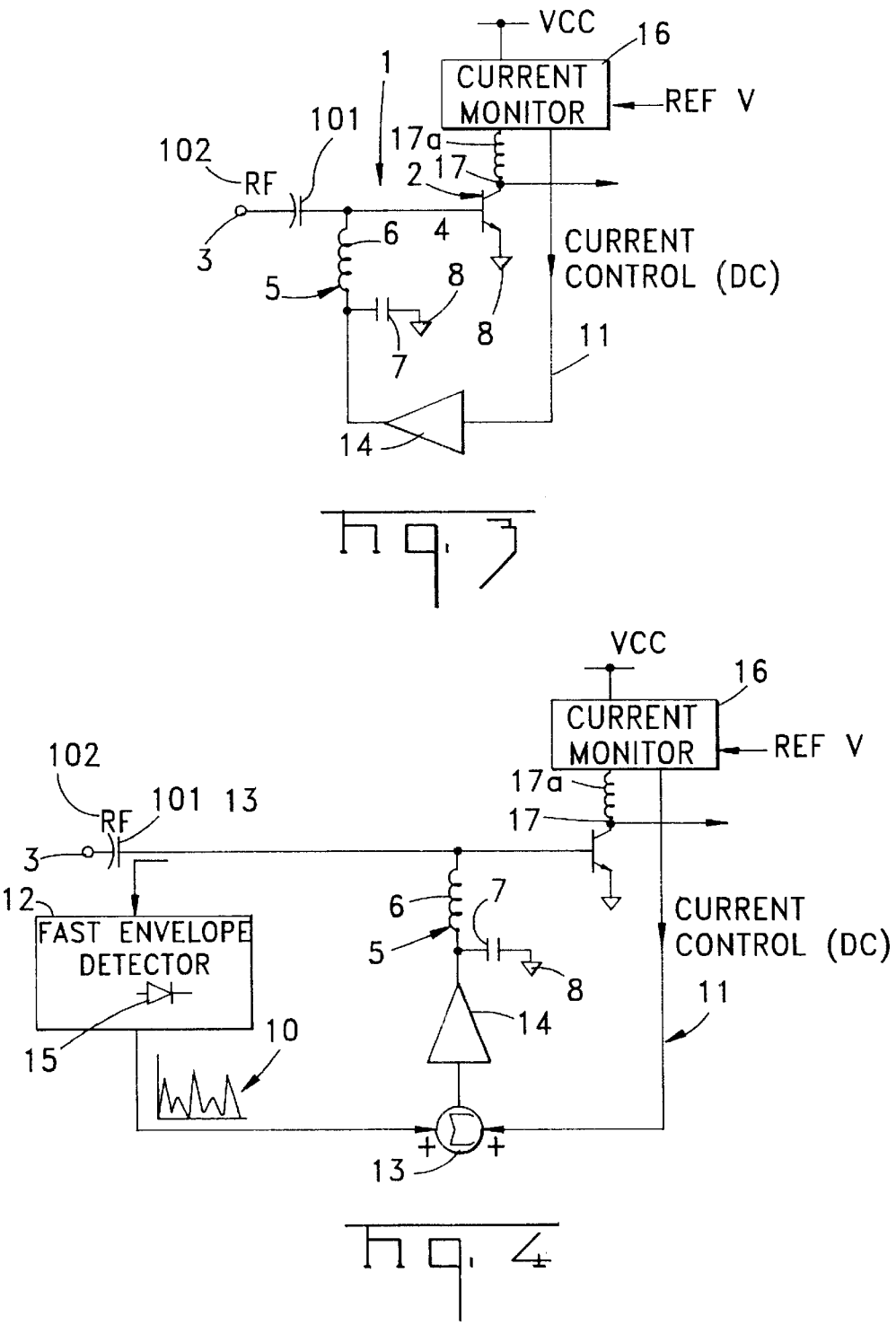

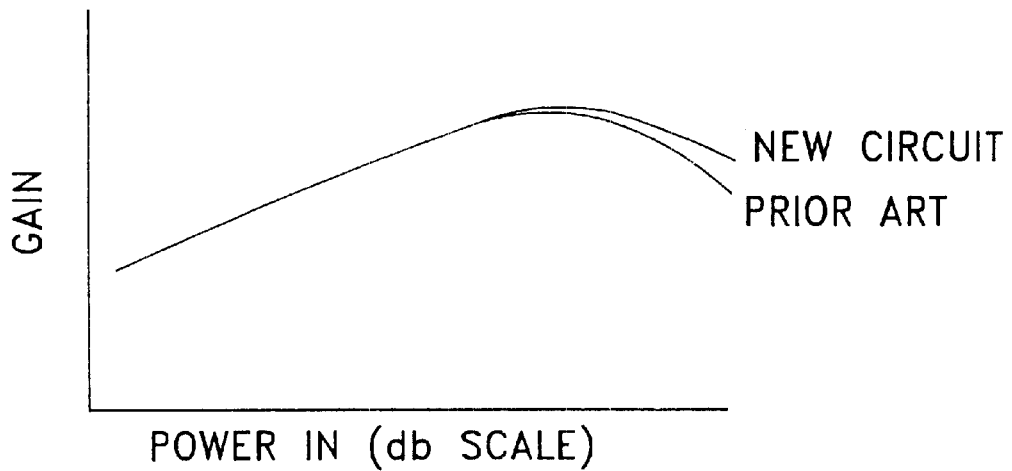
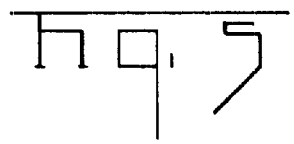
Fig. 5
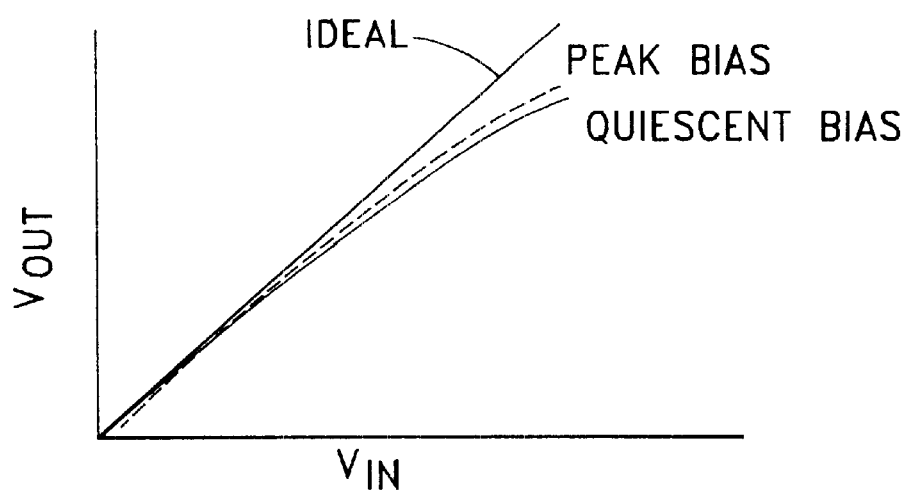
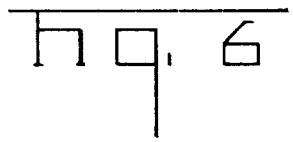
Fig. 6

DETECTOR DRIVEN BIAS CIRCUIT FOR POWER TRANSISTORS

FIELD OF THE INVENTION

The invention relates to a power transistor, and more particularly, to a power transistor having a detector driven bias circuit that adjusts the gain of the power transistor in relation to the power level of an amplified signal.

BACKGROUND OF THE INVENTION

The base or gate bias of a known power transistor operating in an AB mode is provided by a constant voltage source. The constant voltage source applies a bias to the AB mode power transistor that is substantially constant at all signal levels. The bias of a known power transistor operating in an A mode is regulated at a constant level by a circuit control loop that monitors the average transistor current and applies a regulated bias current for biasing the transistor. The bias supplied to the A mode power transistor is substantially constant at all signal levels. For a circuit having a power transistor operating in Class AB mode, a small amount of quiescent current flows even in the absence of an RF signal to be amplified. For a circuit having a power transistor operating in Class A mode, the average current flow is substantially the same for all levels of RF signal to be amplified. Each known transistor has its base voltage, or gate voltage in the case of a field effect transistor, FET or low density metal oxide silicon transistor, LDMS transistor, held constant during power peaks.

It would be desirable to dynamically increase the gain of a power transistor beyond that which would be provided by a known power transistor that has a constant bias at all signal levels. Further, it would be desirable to provide a positive increase in the bias supplied to a power transistor, especially during power peaks, to increase the gain so that the gain is more constant with increasing instantaneous power, relative to the non-compensated circuit.

SUMMARY OF THE INVENTION

The invention is a circuit that detects the envelope of an incoming signal and increases the bias voltage approximately in proportion to the RF voltage of the incoming signal, which increases the gain, particularly at levels of relative peak power. The increase in gain compensates for the normal decrease in gain that the transistor has as its compression point is reached. The decrease in gain is not so much a problem of decreased output as it is a problem of distortion. This distortion is a result of having an undesired signal dependent gain, which makes the transistor nonlinear. The invention reduces the cost per watt of power, particularly at rf, radio frequencies, and is further applicable to reduce the cost per watt of power at other signal frequencies, such as, baseband, video and audio frequencies. This reduction in cost is based on the idea that a smaller device can be used whose total distortion is the same as a larger device with no correction.

Unlike the known circuits in which the base voltage of a transistor is held constant, or the gate voltage for FETs and LMDS power transistors is held constant, especially during power peaks, the invention provides an increase in the base voltage or the gate voltage to increase the instantaneous gain. Further the invention increases the base voltage or the gate voltage approximately proportional to the signal, which increases the gain during power peaks. The effect of the invention in the case of the AB circuit is to push the compression point of the transistor up by approximately 0.5 dB, and more, and to reduce the intermods for a high peak factor signal by typically 3 to 4 dB. The effect of the invention in the case of the Class A circuit is to effectively increase the third order intercept point (IP3) of a given device by as much as 6 dB. Alternatively, a given IP3 performance can be obtained by using a device of half the size/cost, at half the current, in the case of Class A operation. This allows the circuit to obtain the highest compression point for a given cost of the transistor and, in the case of the Class A circuit, for a given current level. The increased compression point, as provided by the invention, is further advantageous to reduce the level of intermodulation signals and spectral regrowth, as the invention maintains low distortion Embodiments of the invention will be described by way of example, with reference to the accompanying drawings.

DESCRIPTION OF THE DRAWINGS

FIG. 1 is a diagram of a Class AB power transistor circuit;

FIG. 2 is a diagram of a Class AB power transistor and amplifier having a detector driven bias circuit for the power transistor.

FIG. 3 is a diagram of a Class A power transistor circuit;

FIG. 4 is a diagram of a Class A power transistor and amplifier having a detector driven bias circuit for the power transistor.

FIG. 5 is a graph depicting Gain versus Input Power on dB scale.

FIG. 6 is a graph depicting the amplified RF signal voltage ($V_{out}$) versus the incoming RF signal voltage (Vin).

DETAILED DESCRIPTION

A known amplifier circuit 1 constituting prior art is disclosed in FIG. 1, and has a power transistor 2 operating in Class AB mode. The power transistor 2 is a BJT (bipolar junction transistor, or an FET, Field Effect Transistor, for example, as one of many types of a base or gate biased power transistor 2. An RF signal at an RF input 102 is supplied to the base 4 of the power transistor 2 through a series RF capacitor 101, and an amplified RF signal is supplied to an RF output port 17. Port 17 is also the RF decoupled collector or drain DC feed. An RF inductor 6 is at the junction of the input 3 and the base 4 of the power transistor 2, and has an RF bypass capacitor 7 in series and referenced to ground or common electrical potential 8. A source of voltage 9, for example, an adjustable, constant voltage source is referenced to ground, and is in series with the inductor 6, which supplies a constant voltage bias to the base 4 that combines with the incoming RF signal over all modulation levels of the incoming RF signal. One of the disadvantages of the amplifier circuit 1 resides in the need for a constant voltage bias, which advantageously avoids excessive bias of the power transistor 2, but which limits the gain of an RF signal, particularly the gain of an RF signal at peak power or peak signal strength. Merely increasing the static gain of the power transistor 2 by increasing the voltage source 9 would increase the gain at all instantaneous input levels and would increase the contribution of signal distortion, intermods, and spectral regrowth, particularly upon amplification of an RF signal of high peak factor. The main benefit is lower intermods for a given device.

Accordingly, prior to the invention the gain of a power transistor 2 was purposely limited, and to attain an increase in gain would have required a larger power transistor 2. A need for a larger power transistor 2 would limit its capacity for miniaturization, and would consume a disproportionate area of a semiconductor wafer of a given size to yield a disproportionate low number of larger power transistors 2. Thus, a need exists for a bias circuit for a power transistor 2 that would increase the gain of an RF signal of peak power or peak signal strength, and would avoid excessive gain for a weaker RF signal.

According to the invention, a smaller power transistor 2, consuming less area of a semiconductor wafer and other semiconductor materials, provides higher gain than was attainable prior to the invention, while avoiding distortion and intermodulation components of an amplified signal of lower signal strength.

The invention provides a detector 11 that drives a bias circuit for a power transistor 2 that adjusts the gain of an RF signal in relation to its instantaneous envelope levels. The typical RF signal has a modulation envelope that varies, as is shown in the diagram 10 in FIGS. 2 and 4. A desired bias circuit for a base biased power transistor 2, operating as Class AB, is disclosed with reference to FIG. 2. The detector 11 has an RF inductor 6 at the base 4 of the power transistor 2. Further the detector 11 has a peak detector 12 that detects relative peaks in an envelope of the incoming RF signal. A bias voltage is provided by the voltage output of the source of voltage 9 being supplied to a voltage summer summer 13. The output of the peak envelope detector 11 varies with the modulation level of the incoming RF signal, and is supplied to the summer 13. The summer 13 combines the respective outputs of the source of voltage 9 source and of the peak detector 12 to bias the power transistor 2 upon detection of a rise in the RF signal modulation level. The summer 13 feeds an amplifier 14 and the inductor 6 The peak detector 12 detects a rise in the modulation level of the incoming RF signal, and provides an output voltage in proportion to the detected modulation level. In general the scaling and voltage gains of the detector, summer, and amplifier 14 are set up so that during the maximum peak condition, the amount of voltage rise at the base/gate of the transistor is small (perhaps 100 mV) in relation to the fixed part of the bias. The output voltage is supplied to the summer 13 together with the constant voltage from the source of voltage 9. Accordingly, the bias is increased, which increases the gain at higher modulation levels of the incoming RF signal. The gain is increased in response to detection of an RF signal with higher modulation levels. This is accomplished by virtue of the device characteristics, without the use of voltage controlled attenuators, which add cost and complexity. The effect of the invention is to push the compression point up by as much as 0.5 dB to attain the maximum gain at relative signal peaks, in the case of AB circuits, and to attain the lowest distortion from a given area of semiconductor materials. With reference to FIG. 5, the Class AB amplifier 1, and power transistor 2 operation, are indicated by the graph depicting Gain vs. Input power, on a dB scale. The graph shows that at higher power levels, the gain is increased. The invention effectively controls the current in the RF amplifier 1 and power transistor 2 dynamically with the modulation level of the input RF signal. A flatter curve of Gain vs. Input Level is produced, which is beneficial to reduce the intermodulation effects of soft clipping in an amplifier 1 that is operated near saturation, and on RF signals with high peak factors.

Further, in response to detection of an RF signal at quiescent and at relatively lower modulation levels, the gain is made more constant with input power and this results in suppressing the amplified distortion and spectral regrowth and other such intermodulation components. The invention has reduced intermodulation components as much as 4 dB in a Class AB Mode power transistor 2.

With further reference to FIG. 2, and according to another embodiment feature of the invention, the peak detector 12 is connected to the summer 13 through a diode 15 having a turn on, threshold potential that is nonconductive below the threshold potential to suppress a relatively low output of the peak detector 12, keeping it from reaching the summer 13. The bias of the power transistor 2 is provided solely by a relatively low, voltage supplied by the constant source of low voltage 9. The gain of the power transistor 2 is thereby further constant for quiescent RF signals and for low RF signal levels, which results in lowering the amplified distortion and spectral regrowth and other such intermodulation components.

With reference to FIG. 3, a known amplifier circuit 1 constituting prior art is disclosed in FIG. 1, and has a power transistor 2 operating in Class A mode. The known power transistor 2 operating in a Class A mode has a bias circuit 11 in the form of a control loop circuit. The circuit 11 has an average current monitor 16 at a junction of the power transistor 2 and an RF output port 17, and provides a current control signal through an amplifier 14 in the circuit, and through the inductor 6 to bias the power transistor 2. The average bias voltage remains constant from quiescent signal conditions to signal peaks. The averaging mechanism is in the current monitor typically, in the form of a capacitor, and must average for a time period that is longer than the lowest frequency modulation components. As shown the power transistor 2 is shown as a BJT power transistor 2, for example. An input RF signal is supplied to the input port and is supplied to the base 4 of the power transistor 2. A diagram 10 in FIG. 4 shows the modulation envelope of a typical RF signal to be amplified. The RF signal has peak modulation levels. However, the known Class A amplifier 1 of FIG. 3 is unable to increase the gain of the power transistor 2 with peak modulated RF signals.

With reference to FIG. 4, the invention provides a detector driven bias circuit 11 for a power transistor 2 that adjusts the gain of an RF signal in relation to its instantaneous envelope levels. The typical RF signal has a modulation envelope that varies, as is shown in the diagram 10 in FIG. 4. A desired bias circuit 11 for a power transistor 2, operating in Class A mode, is disclosed with reference to FIG. 4. The detector 11 has an RF bypass circuit provided by inductor 6, at the base 4 of the power transistor 2. Further the detector 11 has a peak envelope detector 12 that detects relative peaks in an incoming RF signal. The output of the peak envelope detector 12 varies with the modulation level of the incoming RF signal, and is supplied to a summer 13. A current control signal is provided by the voltage output of the current monitor 16, and is supplied to the summer 13. The summer 13 combines the outputs of the current monitor 16 and the peak detector 12 to bias the power transistor 2 upon detection of a rise in the RF signal modulation level. The summer 13 feeds s an amplifier 14 and the inductor 6. The peak detector 12 detects a rise in the modulation level of the incoming signal, and provides an output voltage in proportion to the detected modulation level. The output voltage is supplied to the summer 13 together with the constant current control signal from the current monitor 16. Accordingly, the bias voltage is increased, which increases the gain at higher modulation levels of the incoming RF signal. The gain is increased in response to detection of an RF signal with higher modulation levels. The effect of the invention for Class A circuits is to push the third order intercept point up by as much as 6 dB to attain an increased gain at relative RF signal peaks, and attain the lowest distortion from a given area of semiconductor materials. With reference to FIG. 6, the Class A amplifier 1 operation, and power transistor 2 operation, are indicated by the graph depicting the amplified RF signal voltage, $V_{out}$ vs. the incoming RF signal voltage, $V_{in}$. The curve labeled Ideal represents the gain from quiescent signal to the beginning of soft compression of the power transistor 2. This point is far away from the saturation point (by perhaps 8 to 16 dB) The curve labeled §Quiescent Bias indicates the gain resulting from the prior art Class A operation, wherein the bias voltage is controlled by the control loop circuit to remain the same as that provided to the power transistor 2 at quiescent signal levels. The curve labeled Peak Bias indicates a higher gain at modulation peaks of the input RF signal, particularly at the higher levels. The graph shows that at higher power levels, the gain is increased. FIG. 6 shows a deviation from the ideal line of about 10%, for clarity. In actuality, the invention would more likely be used where the deviation from ideal is a few percent. In many applications, even 1% distortion in the power transfer curve is undesireable. The invention reduces distortion for Class A amplifiers by a voltage factor of about 4, which is 12 dB. This improvement is valid for any starting point where the compression is about 5% at the peaks. The invention effectively controls the current in the RF amplifier and power transistor 2 dynamically with the input RF signal. A flatter curve of $V_{out}$ vs. $V_{in}$ is produced, which is beneficial to reduce the intermodulation effects of soft clipping in an amplifier that is operated in Class A mode and on RF signals with high peak factors.

Further, in response to detection of a signal at quiescent and at relatively lower modulation levels, lower bias voltage is supplied, which results in lower average current, for the same intermod performance. Specifically, the current in the Class A device can be generally cut in half for the same performance with this invention.

With further reference to FIG. 2, and according to another embodiment feature of the invention, the peak detector 12 is connected to the summer through a diode having a turn on, threshold potential that is nonconductive below the threshold potential to suppress a relatively low output of the peak detector 12 from reaching the summer. The bias voltage of the power transistor 2 is provided solely by a relatively low, quiescent bias voltage supplied by the source of low voltage 9. The gain of the power transistor 2 is thereby further limited for quiescent signals and low strength signal levels, which results in lowering the amplified distortion and spectral regrowth and other such intermodulation components.

The circuit can also be used with the detector output AC coupled, with the coupling substantially level down to the lowest frequency of the modulating envelope. This allows a simplification of the detector circuit in terms of temperature compensation.nother modification of this invention would be to put a non-linear transfer function between the detector and the transistor. A transfer function might be a square root function, an exponential function, etc.

Other modifications and embodiments of the invention are intended to be covered by the spirit and scope of the appended claims.

What is claimed is:

1. A power transistor circuit comprising: a power transistor connected to an RF input and a bias circuit having a source of voltage supplying an output connected through an RF inductor to the power transistor, a peak detector supplying an output that increases with detected signal peaks, and a summer supplying the sum of the respective outputs of the peak detector and the source of voltage to the power transistor to increase the bias on the power transistor upon detection of signal peaks.

2. A power transistor circuit as recited in claim 1 wherein, the peak detector is connected to the summer through a diode having a turn on, threshold potential that is nonconductive below the threshold potential to suppress a relatively low output of the peak detector from reaching the summer.

3. A power transistor circuit as recited in claim 1 wherein, the source of voltage is a constant voltage source.

4. A power transistor circuit as recited in claim 3 wherein, the peak detector is connected to the summer through a diode having a turn on, threshold potential that is nonconductive below the threshold potential to suppress a relatively low output of the peak detector from reaching the summer.

5. A power transistor circuit as recited in claim 1 wherein, the source of voltage is a current monitor, and the output of the source of voltage is a current control output.

6. A power transistor circuit as recited in claim 5 wherein, the peak detector is connected to the summer through a diode having a turn on, threshold potential that is nonconductive below the threshold potential to suppress a relatively low output of the peak detector from reaching the summer.

* * * * *